United States Patent
Fietz et al.

(10) Patent No.: US 9,615,478 B2
(45) Date of Patent: Apr. 4, 2017

(54) ARRANGEMENT FOR A BLADE SERVER SLIDE-IN MODULE

(71) Applicant: Fujitsu Technology Solutions Intellectual Property GmbH, München (DE)

(72) Inventors: Ralf-Peter Fietz, Paderborn (DE); Ronny Hesse, Bad Lippspringe (DE)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/427,104

(22) PCT Filed: Mar. 31, 2014

(86) PCT No.: PCT/EP2014/056469
§ 371 (c)(1),
(2) Date: Mar. 10, 2015

(87) PCT Pub. No.: WO2014/187595
PCT Pub. Date: Nov. 27, 2014

(65) Prior Publication Data
US 2016/0081218 A1 Mar. 17, 2016

(30) Foreign Application Priority Data
May 21, 2013 (DE) .................. 10 2013 105 173

(51) Int. Cl.
*H05K 1/14* (2006.01)
*H05K 7/14* (2006.01)
(Continued)

(52) U.S. Cl.
CPC ........... *H05K 7/1489* (2013.01); *G06F 1/185* (2013.01); *G06F 13/409* (2013.01); *G06F 13/4068* (2013.01); *H05K 7/1487* (2013.01)

(58) Field of Classification Search
CPC .. H05K 7/14; H05K 5/00; H05K 7/00; H05K 7/02; H05K 7/04; H05K 1/14; H05K 7/18; H01R 12/73; G06F 1/16
(Continued)

(56) References Cited

U.S. PATENT DOCUMENTS 5,825,618 A * 10/1998 Schnoor ............... H05K 7/1427
361/679.6
6,036,505 A * 3/2000 Zell ........................ H05K 1/145
439/74

(Continued)

FOREIGN PATENT DOCUMENTS

DE 10 2008 034 704 B3 12/2009
JP 6-350274 12/1994
(Continued)

OTHER PUBLICATIONS

Japanese Notice of Reasons for Rejection dated Feb. 2, 2016 from corresponding Japanese Patent Application No. 2015-517813 along with its English translation.

*Primary Examiner* — Hung S Bui
(74) *Attorney, Agent, or Firm* — Fujitsu Patent Center

(57) ABSTRACT

An arrangement for a blade server slide-in module includes a motherboard with a plug connector, a riser card inserted in the plug connector of the motherboard, a carrier plate, in which there is a first opening, is fixed substantially parallel to the motherboard in the blade server slide-in module, the first opening being aligned with exposed plug contacts of the inserted riser card, and a retaining element having a main body in which there is a continuous, second opening, wherein the retaining element is pushed onto the riser card in a positive locking manner by the second opening and locks with the carrier plate so that the riser card is securely (Continued)

mechanically fixed to the carrier plate and the plug contacts of the riser card are accessible via the second opening.

13 Claims, 4 Drawing Sheets

(51) Int. Cl.
　　*G06F 1/18* (2006.01)
　　*G06F 13/40* (2006.01)
(58) Field of Classification Search
　　USPC ........ 361/728–730, 736, 740, 759, 801–802, 361/807, 809–810
　　See application file for complete search history.

(56) References Cited

U.S. PATENT DOCUMENTS

| | | | |
|---|---|---|---|
| 6,282,087 | B1 | 8/2001 | Gibbons et al. |
| 6,394,300 | B1* | 5/2002 | Bosy ............... H01M 2/1055 220/242 |
| 7,381,095 | B2* | 6/2008 | Freeman ............... G06F 1/1632 361/679.41 |
| 7,580,255 | B2* | 8/2009 | Crooijmans .......... G06F 1/1632 361/679.41 |
| 7,589,974 | B2* | 9/2009 | Grady .................. H05K 7/1492 174/520 |
| 7,656,671 | B2* | 2/2010 | Liu ........................ G06F 1/185 361/735 |
| 2005/0152122 | A1 | 7/2005 | Fan et al. |
| 2006/0063400 | A1* | 3/2006 | Tsai ....................... H01R 31/06 439/74 |
| 2006/0181840 | A1* | 8/2006 | Cvetko .................. B60R 11/02 361/679.55 |
| 2011/0075358 | A1 | 3/2011 | Fietz et al. |
| 2013/0027875 | A1 | 1/2013 | Zhu et al. |

FOREIGN PATENT DOCUMENTS

| | | |
|---|---|---|
| JP | 8-18257 | 1/1996 |
| JP | 2012-511245 | 5/2012 |

* cited by examiner

ARRANGEMENT FOR A BLADE SERVER SLIDE-IN MODULE

TECHNICAL FIELD

This disclosure relates to an arrangement for a blade server slide-in module, which comprises a motherboard with a plug connector and a riser card inserted in the plug connector of the motherboard.

BACKGROUND

In general, a blade server system comprises a plurality of blade server slide-in modules inserted in the form of insert modules into a server frame. Blade server slide-in modules are normally of very flat and compact construction and mostly arranged vertically side by side in the server frame. Blade server slide-in modules normally only comprise their own motherboard, working memory and one to two hard drives. Further components needed for operation such as, for example, power supplies (mains adapters), network switches and/or fans are usually provided by other connection modules arranged in the blade server system or by other assemblies and are jointly used by the blade server slide-in modules. The electrical connection between the blade server slide-in modules and, for example, the connection modules is often achieved by a printed circuit board with suitable connections. Such a printed circuit board is here typically arranged vertically in the middle of the blade server system behind the blade server slide-in modules and is known as a midplane or backplane. Such a midplane or backplane has two sides, each with a plurality of terminals in the form of plug connectors (plug and/or sockets).

Due to the compact construction and form factor of a blade server slide-in module and the tightly packed arrangement of components inside a blade server slide-in module, it is difficult to extend a blade server slide-in module with, for example, an expansion card. In addition, consideration also has to be given to the generally complex cooling of a blade server slide-in module, which must not be hampered by the expansion card. Generally, expansion cards are mounted in a blade server slide-in module using what are known as riser cards. Riser cards are inserted perpendicular to a motherboard of a blade server slide-in module into the motherboard.

The riser card is generally installed in the blade server slide-in module so that it is not readily accessible and, therefore, plugging in an expansion card proves awkward if the blade server slide-in module is not opened or removed. Often when mounting an expansion card onto the riser card, the plug contacts of the riser card and/or of the corresponding plug connectors of the expansion card are not easily visible and, therefore, during the mounting process damage may occur to the plug contacts or the plug connector of other components inside the blade server slide-in module. Another disadvantage of existing systems is encountered when removing a plugged-in expansion card. If, for example, an expansion card is removed from the riser card, it is not certain whether the riser card will be unplugged together with the expansion card or will remain in the plug connector of the motherboard. If the riser card remains, for example, on the expansion card, then removal of the expansion card and the riser card is difficult and may cause damage to other components.

It could therefore be helpful to provide an arrangement for a blade server slide-in module which permits a reliable mounting and removal of a riser card. Preferably, it shall also be possible to mount an expansion card on and remove it from a riser card in a reliable manner.

SUMMARY

We provide an arrangement for a blade server slide-in module including a motherboard with a plug connector, a riser card inserted in the plug connector of the motherboard, a carrier plate in which there is a first opening, is fixed substantially parallel to the motherboard in the blade server slide-in module, the first opening being aligned with exposed plug contacts of the inserted riser card, and a retaining element having a main body in which there is a continuous, second opening, wherein the retaining element is pushed onto the riser card in a positive locking manner by the second opening and locks with the carrier plate so that the riser card is securely mechanically fixed to the carrier plate and the plug contacts of the riser card are accessible via the second opening.

Figure 1:
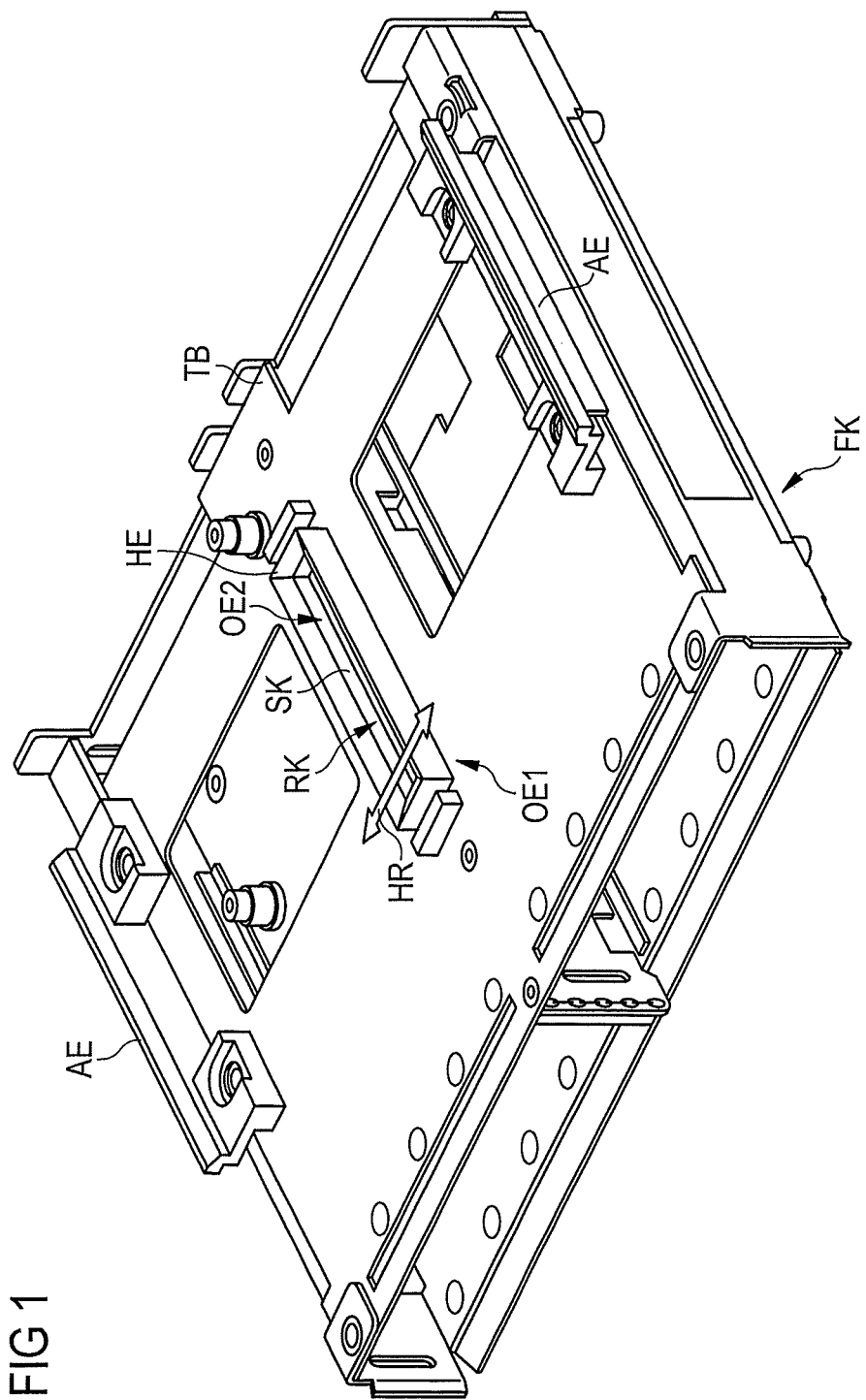
FIG. 1 shows a schematic three-dimensional view of an arrangement with a retaining element according to a first example.

| List of Reference Signs | |
|---|---|
| A1 | Recess |
| A2 | Recess |
| AE | Support element |
| AF | Stop face |
| AO | Arrangement |
| BF | Boundary face |
| EK | Expansion card |
| ER | Insertion direction |
| F | Bevel |
| FK | Hard drive cage |
| GE | Handle element |
| GK | Main body |
| HE | Retaining element |
| HP | Motherboard |
| HR | Horizontal direction |
| K | Notch |
| N | Groove |
| OE1 | Opening |
| OE2 | Opening |
| R | Direction |
| RE1 | Catch element |
| RE2 | Catch element |
| RK | Riser card |
| SK | Plug contacts |
| SV | Plug connector |
| TB | Carrier plate |
| UA | U-shaped segment |
| US | Underside |

-continued

List of Reference Signs

| | |
|---|---|
| UST | Underside |
| V1 | Projection |
| V2 | Projection |

DETAILED DESCRIPTION

We provide an arrangement for a blade server slide-in module which has a motherboard with a plug connector. The arrangement further comprises a riser card inserted in the plug connector of the motherboard. A carrier plate in which there is a first opening, is fixed substantially parallel to the motherboard in the blade server slide-in module, the first opening being aligned with exposed plug contacts of the inserted riser card. Furthermore, the arrangement comprises a retaining element having a main body in which there is a continuous, second opening. The retaining element is designed to be pushed onto the riser card in a positive locking manner by the second opening and to lock with the carrier plate so that the riser card is securely mechanically fixed to the carrier plate and the plug contacts of the riser card are accessible via the second opening.

In general, "positive locking" can also be called "interlocking" Locking also means snapping in place or clicking The parallel arrangement of the carrier plate means that the carrier plate is arranged in a (main) extension plane parallel to a (main) extension plane of the motherboard.

This arrangement in accordance with the first aspect provides for the riser card to be fixedly and securely mechanically connected to the carrier plate of the blade server slide-in module. The retaining element ensures that the exposed plug contacts of the riser card are accessible via the second opening so that, for example, an expansion card can be plugged onto the riser card. Because the riser card is fixed to the carrier plate, when an expansion card plugged onto the riser card is removed, the riser card itself is prevented from being unplugged or removed from the motherboard. The riser card is thus always plugged into the motherboard. In other words, this means that the expansion card with plugged-in riser card cannot be removed as a unit. Such a unit would be more difficult to manipulate and because of the narrow and compact construction and arrangement of a blade server slide-in module could easily damage other components, for example, due to electrostatic charge. In addition, the mounting (both of the unit or separately) would be more difficult since the riser card has to be a plugged downwards into the motherboard and the normally concealed plug connector on the motherboard has to be located. In addition, a vertical tilting or a bending of the riser card can be prevented so that the riser card is always held in a vertical position, that is, perpendicular to the extension plane of the motherboard.

Advantageously, the arrangement further comprises an expansion card designed to be plugged by a plug connector of the expansion card into the second opening in the retaining element to connect with the plug contacts of the riser card such that the expansion card is seated against a face of the retaining element containing the second opening in the retaining element. The expansion card thus rests on the retaining element and the weight of the expansion card can be supported via the retaining element on the carrier plate. The weight of the expansion card is therefore not, or at least not fully, transferred or passed to the riser card, thereby relieving the load on the riser card. This additionally ensures a stable arrangement of the expansion card and the riser card so that inter alia virtually no or only very slight vibrations of the expansion card and/or riser card can occur.

Further advantageously, the exposed plug contacts of the riser card are arranged substantially inside the second opening in the retaining element. As a result, the plug contacts of the riser card are substantially protected against contact with other components.

Still further advantageously, the main body of the retaining element has at least two first resilient catch elements and the riser card has at least two recesses so that the at least two first catch elements lock into the at least two recesses when the retaining element is pushed onto the riser card and the retaining element is securely mechanically coupled to the riser card. Firstly, this enables the retaining element to be securely mechanically connected to the riser card. Secondly, before inserting the riser card into the motherboard, it is thereby possible to attach the retaining element to, or mount it on, the riser card. The riser card and the retaining element can then jointly be mounted on or inserted in the blade server slide-in module. This ensures easy assembly.

Further advantageously, the main body of the retaining element has at least two second resilient catch elements to lock (or snap-in) the retaining element to the carrier plate. This presents a simple option to lock the retaining element to the carrier plate. The retaining element can thus simply be inserted or clipped into the carrier plate and lock into place with the same.

Further advantageously, the main body of the retaining element has at least two second resilient catch elements to lock the retaining element to the carrier plate and two U-shaped segments arranged opposite one another are molded from the main body of the retaining element. In this case, a U-shaped segment has arranged thereon in each case a first resilient catch element and in each case a second resilient catch element. As a result, it is possible for the retaining element to be locked in place in a simple manner both with the riser card and with the carrier plate. In addition, the retaining element can be removed in simple manner since both the first and the second resilient catch elements are joined by a U-shaped segment and can thus be jointly unclipped or unlocked. "Unclipped" means that the snapped-in connection or locked connection is released. For example, unlocking can be enabled by virtue of the fact that the U-shaped segments each have a handle element which can be manually operated to release respective catch elements that are locked in place.

Further advantageously, the plug connector of the expansion card can be received in a positive locking manner in the second opening in the retaining element. The expansion card is thus securely mechanically fixed inside the retaining element.

Further advantageously, at outer edges that define the second opening the retaining element has one or more bevels. As a result, it is possible, for example, for a plug connector in the expansion card to assume the correct inserted position when it is plugged onto the riser card. This is helpful, for example, when the plug connector of the expansion card is not easily visible and is brought only approximately into the correct position above the riser card. By virtue of the bevels, the plug connector of the expansion card would then slide or slip into the correct position. The retaining element thus produces a funnel effect.

Further advantageously, in the region of the second opening the retaining element has two grooves arranged opposite and designed to engage laterally around the riser card. As a result, lateral tilting or bending of the riser card is basically impossible. The riser card is thus guided laterally inside or on the retaining element.

Further advantageously, the carrier plate is a side part of a hard drive cage. It is thus unnecessary, for example, to make additional structural arrangements or to use additional components.

Further advantageously, the arrangement comprises at least one support element arranged in the server slide-in module and designed to support an expansion card inserted into the second opening in the retaining element. Such a support element can be arranged, for example, in the edge region of the expansion card inside the server slide-in module. An expansion card, for example, which extends over a large area inside the blade server slide-in module, can thus be laterally supported, thereby substantially avoiding vibrations of the expansion card. In addition, the weight of the expansion card is distributed not just on the retaining element and/or the riser card.

Further advantageously, the at least one support element comprises a projection parallel to an insertion direction of the expansion card and the expansion card comprises one or more recesses, wherein upon insertion of the expansion card the projection of the at least one support element is received in a positive locking manner in a corresponding recess. It can thus additionally be ensured that the expansion card assumes the correct mounted position as it is inserted. As it is inserted, the expansion card is thus guided by a projection. The recess can be provided in the form, for example, of a slotted guide for the projection. In addition, for example, a movement of the expansion card in a direction parallel to a (main) extension plane of the expansion card is prevented.

Further advantageously, the retaining element is produced in one piece and/or from a plastics material. The retaining element can thus be produced inexpensively in a simple manner, for example, by an injection molding process.

Further advantages are disclosed in the following detailed description of examples.

The examples are described hereinafter with the aid of the appended figures. In the figures, similar components of different examples are provided with the same reference signs. Features of the examples already defined by reference signs are not necessarily provided with reference signs in all figures.

FIG. 1 shows an arrangement AO for a blade server slide-in module according to a first example. The arrangement AO comprises a hard drive cage FK arranged and/or mechanically fixed inside the blade server slide-in module (not shown). For example, the hard drive cage FK is screwed to the motherboard HP. The hard drive cage FK comprises on an upper face a carrier plate TB. The arrangement AO further comprises a riser card RK inserted in a plug connector of a motherboard (see FIG. 4). The motherboard is arranged beneath the hard drive cage FK. In the carrier plate TB there is a first opening OE1, which is aligned with exposed plug contacts SK of the inserted riser card RK. The arrangement AO further comprises a retaining element HE, in which there is a second opening OE2. The retaining element HE is pushed by the second opening OE2 onto the riser card RK to create an interlocking connection and locks into place with the carrier plate TB in the region of the first opening OE1. The riser card RK is thereby mechanically securely fixed to the carrier plate TB, wherein the exposed plug contacts SK of the riser card RK are accessible from above via the second opening OE2. The arrangement AO additionally comprises two support elements AE, which in the example shown are mechanically fixed to the carrier plate TB, for example, by a screwed connection, riveted connection or some other connecting technique.

The carrier plate TB need not necessarily be part of a hard drive cage FK. The carrier plate TB can alternatively be a separate element mounted in the blade server slide-in module.

The retaining element HE has several functions. The retaining element HE is designed on the one hand to fix the riser card RK mechanically securely to the carrier plate TB. If, for example, an expansion card is plugged onto the riser card RK, then the riser card RK remains plugged into the plug connector of the motherboard when the expansion card is removed. Unplugging of the riser card RK in a vertical direction is prevented.

In addition, a tilting or pivoting of the vertically arranged riser card RK and/or a horizontal movement of the riser card RK in the horizontal direction HR shall be prevented. For example, it should not be possible to pivot or tilt the riser card RK about a plug connector of the motherboard into which the riser card RK is plugged.

Another function of the retaining element HE is to ensure that the weight of an inserted expansion card is not transferred completely to the riser card RK. If the weight were to be transferred completely to the riser card RK, this would encourage a tilting in a horizontal direction HR. In addition, the motherboard plug connector in which the riser card RK is plugged, and the riser card RK itself, would be subjected to mechanical load. This can cause both mechanical and electrical damage.

Another function of the retaining element HE is to facilitate insertion of an expansion card at the riser card RK so that, for example, the correct insertion position for the expansion card can be achieved. For example, it is thus possible without problems to insert a plug connector of the expansion card correctly into the second opening OE2 and connect it to the plug contacts SK of the riser card RK. This is helped, for example, by the provision of several bevels on the retaining element HE (see FIG. 2).

The support elements AE are designed to support an inserted expansion card laterally and/or facilitate the mounting of an expansion card.

The constructions and functions of the retaining element HE and the support elements AE are described in detail with the help of the following figures.

Figure 2:
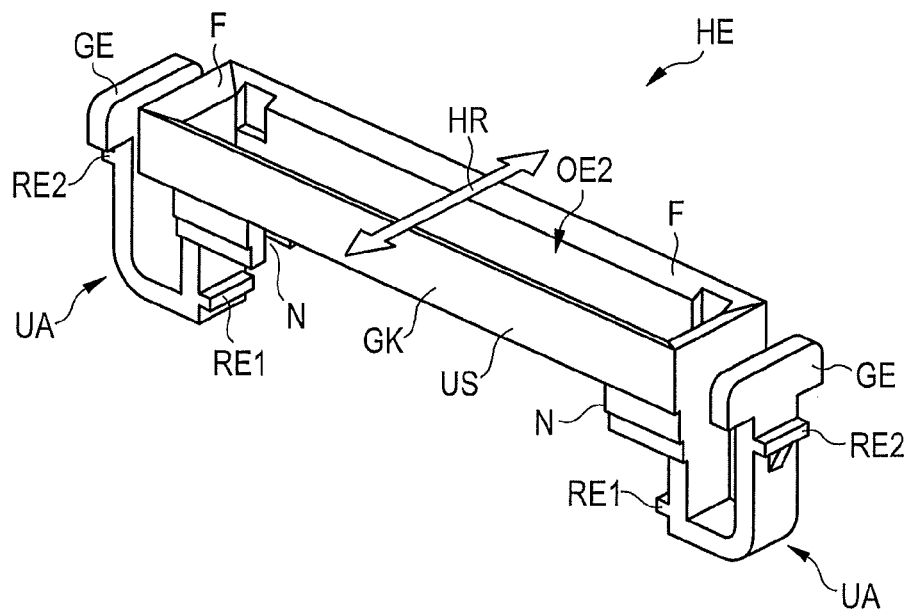
FIG. 2 shows a schematic three-dimensional view of the retaining element according to the first example.
Figure 3:
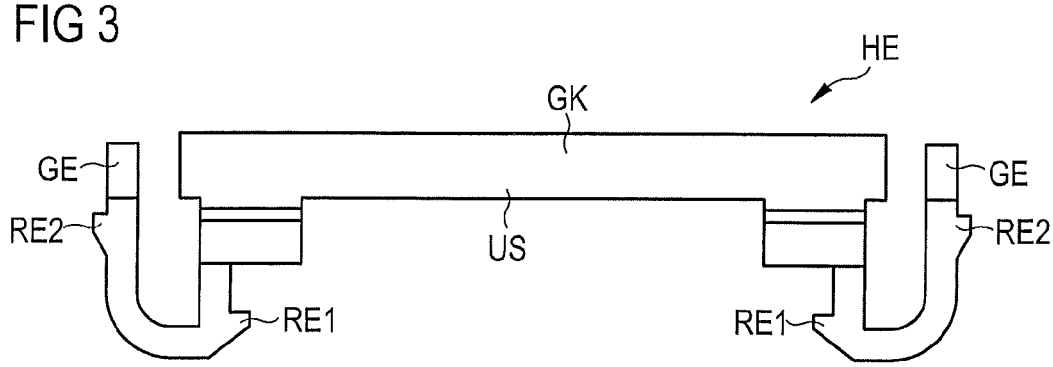
FIG. 3 shows a schematic lateral view of the retaining element according to the first example.

FIGS. 2 and 3 show a first example of the retaining element HE shown in FIG. 1. The retaining element HE has the second opening OE2, which is introduced continuously in a main body GK of the retaining element HE. The second opening OE2 is substantially slot-shaped and adapted to a plug connector of an expansion card and/or to a shape of the riser card RK. Two opposite grooves N, which can also be referred to as recesses or pockets, are introduced or made inside the second opening OE2 and/or on an underside US of the retaining element HE. The grooves N are designed to guide the riser card RK laterally and to engage around it. In this connection, the arrangement of the grooves N is not restricted to the example shown. On the contrary, the arrangement can be configured in a variety of ways to ensure the lateral guidance of the riser card RK. If, for example, the retaining element HE has been pushed onto the riser card RK, then essentially the riser card RK cannot be tilted or pivoted in the horizontal direction HR and be brought out of its vertical position. The retaining element HE furthermore comprises first catch elements RE1 and second catch elements RE2 formed on a U-shaped segment UA. The U-shaped segment UA is molded from the main body GK.

In the mounted state of the retaining element HE, as shown in FIG. 1, the underside US is arranged on the carrier plate TB. The underside US rests in this case on the carrier plate TB touching the same. The weight of an expansion card connected to the riser card RK can therefore be transferred via the retaining element HE to the carrier plate TB.

The first catch elements RE1 and the second catch elements RE2 are of resilient design. This is due to the fact that the U-shaped segment UA is of elastic design, for example, owing to an elastic plastics material. The first catch elements RE1 and the second catch elements RE2 are designed to lock with the riser card RK and the carrier plate TB, respectively. This is shown by FIG. 4.

Figure 4:
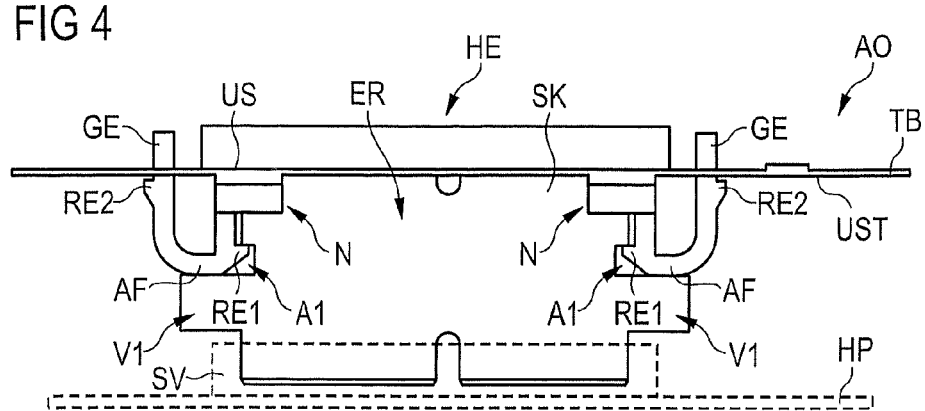
FIG. 4 shows a schematic lateral view of the arrangement.

FIG. 4 shows a schematic lateral view of the arrangement AO according to FIG. 1. The riser card RK is here inserted in a plug connector SV of the motherboard HP (illustrated by a broken line). The retaining element HE is pushed onto the riser card RK, the grooves N engaging laterally around the riser card RK in the upper region. In the pushed in or plugged in state of the retaining element HE the first catch elements RE1 are locked with the riser card RK, wherein the first catch elements RE1 are snapped into place in a substantially interlocking manner in recesses A1 of the riser card RK. The second catch elements RE2 are locked with the carrier plate TB, wherein the second catch elements RE2 are guided through the first opening OE1 in the carrier plate TB and lock in place with an underside UST of the carrier plate TB. A tilting of the riser card RK about the plug connector SV of the motherboard HP (in a direction perpendicular to the image plane of FIG. 4) is thus impossible.

So that the riser card RK cannot be taken through the retaining element HE and the first opening OE1 of the carrier plate opposite to an insertion direction ER, for example, when an expansion card plugged onto the riser card RK is removed, the riser card RK has projections V1. The projections V1 are arranged so that they touch or are slightly spaced from stop faces AF of the retaining element HE. Because the retaining element HE is locked with the carrier plate TB by the underside US and the second catch elements RE2, the riser card cannot be removed, since the projections V1 rest against the stop faces AF of the retaining element HE and the U-shaped segments UA and prevent and/or block unplugging of the riser card RK in a direction opposite to the insertion direction ER. The riser card RK is thus fixed in the vertical (perpendicular) direction in relation to an extension plane of the motherboard HP.

As can be seen in FIG. 2, at outer edges, which define the second opening OE2, the retaining element HE has one or more bevels F. The bevels F enable a plug connector of an expansion card to be correctly inserted into the second opening OE2 so that the plug connector of the expansion card can be connected to the plug contacts SK of the riser card RK. The bevels F form, for example, a funnel effect. If, for example, an expansion card is to be plugged onto the riser card RK, the riser card RK being accessible only with difficulty or the plug connector of the expansion card being visible only with difficulty, then it is sufficient to position the plug connector of the expansion card approximately level with the retaining element HE. Slight pressure can then be used to bring the plug connector of the expansion card into the correct position and into contact with the riser card RK.

In an alternative (not illustrated), the retaining element HE may also have no bevels F and the funnel effect and/or guidance of the plug connector of a plug-in card can be achieved in some other way. For example, the edge defining the second opening OE2 could be stepped, the steps sloping towards the interior of the second opening OE2.

In the example shown, the retaining element HE is formed as one part and consists of a plastics material. For example, such a retaining element HE can be produced by an injection molding process. The retaining element HE can thus be produced in a simple manner and inexpensively. Alternatively, the retaining element HE can also be produced from a different material and/or be of multi-part construction.

The retaining element HE according to FIGS. 2 and 3 can lock with the riser card RK by the first catch elements RE1 so that the riser card RK and the retaining element HE form one unit or one module. Thus, for example, it is possible first to form this module and subsequently, by the retaining element HE fixed to the riser card RK, to plug the riser card RK into the plug connector of the motherboard. Because the first opening OE1 in the carrier plate TB is aligned with the riser card and hence with the plug connector SV of the motherboard HP, the riser card is guaranteed to be plugged in securely at the plug connector SV of the motherboard HP provided for that purpose.

To facilitate pushing or plugging of the retaining element HE onto the riser card RK and/or the carrier plate TB, the retaining element HE has handle elements GE (see FIG. 4). The handle elements GE are arranged on a U-shaped segment UA. For example, the handle elements GE can be knurled on external faces for improved haptics. The handle elements GE can likewise be used to release and/or unlock the retaining element HE from the carrier plate TB and/or the riser card RK, wherein the handle elements can be pressed towards the main body GK of the retaining element HE. Other configurations of the handle elements GE are possible, for example, the handle elements GE can be arranged at a different position on the retaining element.

Figure 5:
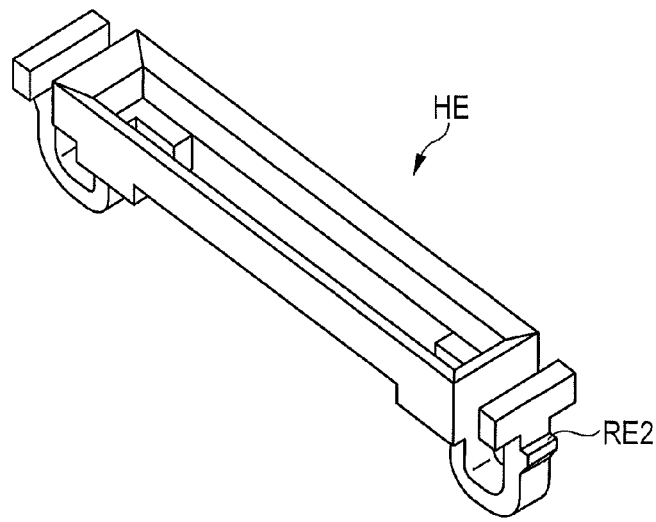
FIG. 5 shows a schematic three-dimensional view of a retaining element according to a second example.
Figure 6:
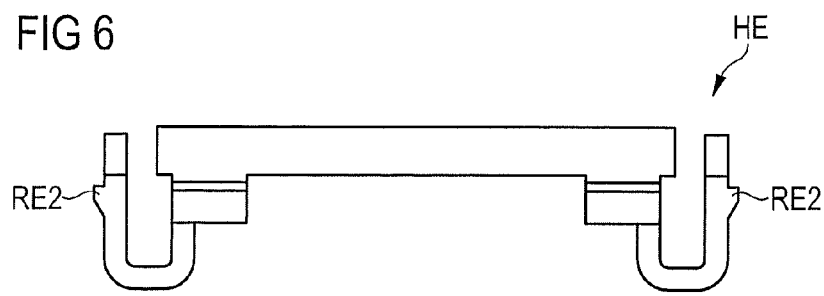
FIG. 6 shows a schematic lateral view of the retaining element according to the second example.

FIGS. 5 and 6 show another, second example of the retaining element HE. The retaining element HE shown in these figures comprises substantially the same features as the retaining element HE of FIGS. 2 to 4, but the retaining element HE has no first catch elements RE1. Such a retaining element HE cannot therefore be firmly and securely mechanically fixed to the riser card before the riser card RK is mounted on the motherboard. Such a retaining element HE requires the riser card RK to be already plugged into the motherboard. As a result, a retaining element HE can be produced more cost-effectively than a retaining element HE according to FIGS. 2 to 4.

The retaining element HE, in particular the first and/or second catch elements RE1 and RE2 and/or the U-shaped segments UA, can alternatively also be differently configured. Such design possibilities are familiar, although it should be borne in mind that the particular functions of a retaining element HE are fulfilled.

Figure 7:
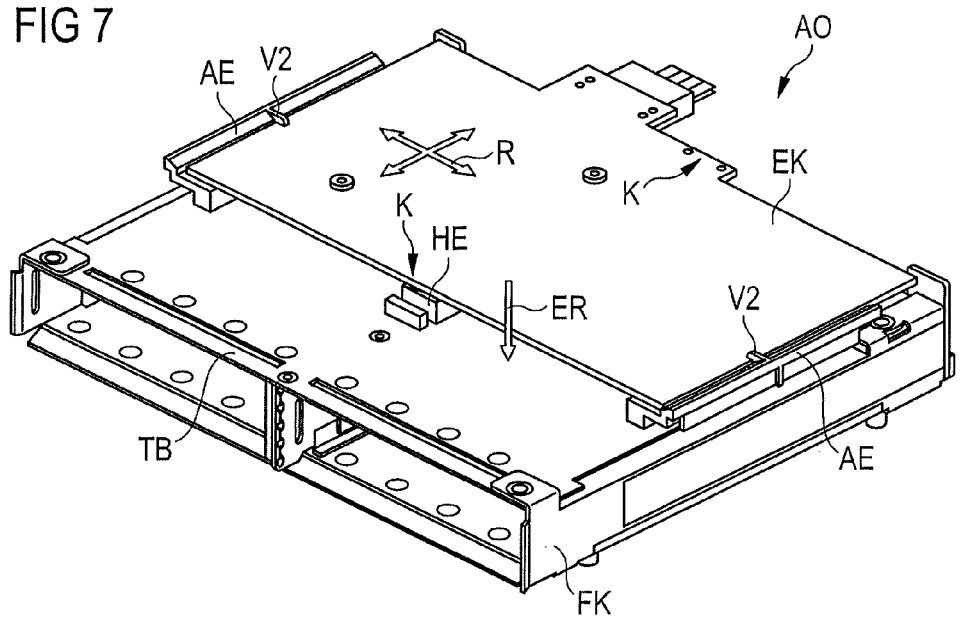
FIG. 7 shows a schematic three-dimensional view of an arrangement with two support elements.

FIG. 7 shows another, second example of an arrangement AO for a blade server slide-in module which comprises substantially the features of the arrangement AO according to FIG. 1. In addition, the arrangement AO comprises an expansion card EK, which has been inserted into the second opening OE2 in the retaining element HE and is plugged onto the plug contacts of the riser card RK. The expansion card EK rests on the retaining element HE and the outer edges which define the second opening OE2 in the retaining element.

The weight of the expansion card EK can thus be distributed via the retaining element HE to the carrier plate TB. The weight of the expansion card EK is thus not entirely transferred to the riser card RK and the plug connector SV of the motherboard HP. Mechanical damage to the riser card RK and the motherboard HP are thereby avoided. The arrangement AO enables the expansion card EK to be reliably connected to the riser card RK despite the confined and limited installation space and the form factor of a blade server slide-in module. Cooling of a blade server slide-in module, which runs substantially parallel to the plane of extension of the expansion card EK, is thus substantially not affected or hindered. The plug connector of the expansion card EK can be plugged securely onto the riser card RK. Even if the plug contacts SK of the riser card RK and/or the plug connector of the expansion card EK are not visible, it is sufficient to position the plug connector of the expansion card EK approximately level with the retaining element HE, wherein the plug connector is guided, for example, by virtue of the bevels F of the retaining element HE, into the second opening OE2 and can be connected to the plug contacts of the riser card RK.

FIG. 7 additionally shows two support elements AE which, compared to FIG. 1, additionally each have a projection V2. The support elements AE are shown in detail in FIG. 8.

Figure 8:
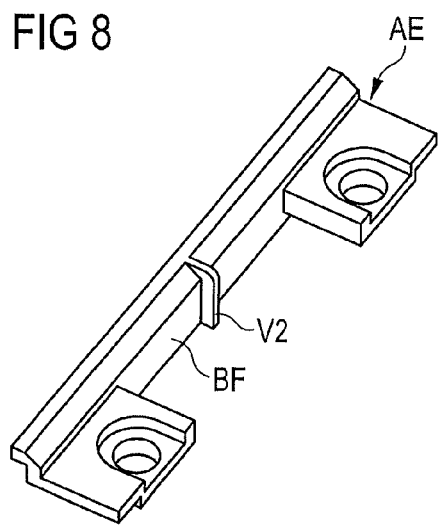
FIG. 8 shows a schematic three-dimensional view of the support element.
Figure 9:
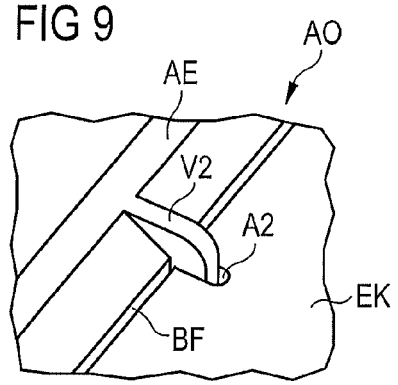
FIG. 9 shows a schematic three-dimensional detail view of the arrangement according to the second example.

FIG. 8 shows a support element AE according to the arrangement AO from FIG. 7. The support element AE has the projection V2, which is designed to be guided in an interlocking manner in a recess A2 of the expansion card EK. This can be seen with the help of an enlarged illustration in FIG. 9. The projection V2 is here received with an interlocking fit in the recess A2.

For example, when mounting the expansion card EK, the expansion card EK is brought to the level of the support elements AE so that the expansion card is connected in an interlocking manner by the recesses A2 with the projections V2 of the support elements AE. The expansion card EK can then be pressed downwards in the insertion direction ER so that the plug connector of the expansion card EK is connected correctly and securely with the riser card RK. The expansion card EK rests here with its outer faces against boundary faces BF of the support elements AE. This ensures that the expansion card EK is fixed in its extension plane in all directions R and thus all degrees of freedom apart from one degree of freedom are suppressed. The one free degree of freedom corresponds to the unplugging direction of the expansion card opposite to the insertion direction ER. During operation, this degree of freedom can be suppressed, for example, by a housing cover of the blade server slide-in module. Displacement of the expansion card EK in the directions R is also blocked by the retaining element HE.

In addition, in an expansion card EK at the level of the plug connector or of the retaining element HE, notches K can be worked in outer edges of the expansion card EK so that the expansion card EK can be plugged in, that is, mounted, in a simple manner, and/or removed. The notches K enable the expansion card EK to be gripped better. The notches K can also be formed as troughs or have other configurations.

Our arrangements are not limited to the examples specified. In particular, it is possible to combine the features and functions of the different examples with one another to obtain the relevant advantages or functions.

The invention claimed is:

1. An arrangement for a blade server slide-in module comprising:
a motherboard with a plug connector;
a riser card inserted in the plug connector of the motherboard;
a carrier plate, in which there is a first opening, is fixed substantially parallel to the motherboard in the blade server slide-in module, the first opening being aligned with exposed plug contacts of the inserted riser card; and
a retaining element having a main body in which there is a continuous, second opening, wherein the retaining element is pushed onto the riser card in a positive locking manner by the second opening and locks with the carrier plate so that the riser card is securely mechanically fixed to the carrier plate and the plug contacts of the riser card are accessible via the second opening.

2. The arrangement according to claim 1, further comprising an expansion card which is plugged by a plug connector of the expansion card into the second opening in the retaining element to connect with the plug contacts of the riser card such that the expansion card rests on a face of the retaining element containing the second opening in the retaining element.

3. The arrangement according to claim 2, wherein the plug connector of the expansion card can be received in a positive locking manner in the second opening in the retaining element.

4. The arrangement according to claim 2, further comprising at least one support element arranged in the blade server slide-in module and supports an expansion card inserted into the second opening in the retaining element.

5. The arrangement according to claim 4, wherein the at least one support element comprises a projection parallel to an insertion direction of the expansion card and the expansion card comprises one or more recesses, wherein upon insertion of the expansion card the projection of the at least one support element is received in a positive locking manner in a corresponding recess.

6. The arrangement according to claim 1, wherein the plug contacts of the riser card are arranged substantially inside the second opening in the retaining element.

7. The arrangement according to claim 1, wherein the main body of the retaining element has at least two second resilient catch elements to lock the retaining element to the carrier plate.

8. The arrangement according to claim 1, wherein at outer edges that define the second opening the retaining element has one or more bevels.

9. The arrangement according to claim 1, wherein the carrier plate is a side part of a hard drive cage.

10. The arrangement according to claim 1, wherein the retaining element is produced in one piece and/or from a plastics material.

11. An arrangement for a blade server slide-in module comprising:
a motherboard with a plug connector;
a riser card inserted in the plug connector of the motherboard;
a carrier plate, in which there is a first opening, is fixed substantially parallel to the motherboard in the blade server slide-in module, the first opening being aligned with exposed plug contacts of the inserted riser card; and
a retaining element having a main body in which there is a continuous, second opening, wherein the retaining element is pushed onto the riser card in a positive locking manner by the second opening and locks with the carrier plate so that the riser card is securely mechanically fixed to the carrier plate and the plug contacts of the riser card are accessible via the second opening, wherein the main body of the retaining element has at least two first resilient catch elements and the riser card has at least two recesses so that the at least two first catch elements lock into the at least two recesses when the retaining element is pushed onto the riser card and the retaining element is securely mechanically coupled to the riser card.

12. The arrangement according to claim 11, wherein the main body of the retaining element has at least two second resilient catch elements that lock the retaining element to the carrier plate, and wherein two U-shaped segments lying opposite each other are molded from the main body of the retaining element, wherein a U-shaped segment has arranged thereon in each case a first resilient catch element and in each case a second resilient catch element.

13. An arrangement for a blade server slide-in module comprising:

a motherboard with a plug connector;

a riser card inserted in the plug connector of the motherboard;

a carrier plate, in which there is a first opening, is fixed substantially parallel to the motherboard in the blade server slide-in module, the first opening being aligned with exposed plug contacts of the inserted riser card; and a retaining element having a main body in which there is a continuous, second opening, wherein the retaining element is pushed onto the riser card in a positive locking manner by the second opening and locks with the carrier plate so that the riser card is securely mechanically fixed to the carrier plate and the plug contacts of the riser card are accessible via the second opening, wherein, in a region of the second opening the retaining element has two grooves arranged opposite and engage laterally around the riser card.

* * * * *